United States Patent
Caparros Jimenez

(10) Patent No.: US 9,000,293 B2
(45) Date of Patent: Apr. 7, 2015

(54) REFLECTIVE PHOTOVOLTAIC SOLAR CONCENTRATION SYSTEM

(75) Inventor: Sebastian Caparros Jimenez, Seville (ES)

(73) Assignee: Abengoa Solar New Technologies, S.A., Seville (ES)

( * ) Notice: Subject to any disclaimer, the term of this patent is extended or adjusted under 35 U.S.C. 154(b) by 0 days.

(21) Appl. No.: 13/876,468

(22) PCT Filed: Sep. 22, 2011

(86) PCT No.: PCT/ES2011/070659
§ 371 (c)(1), (2), (4) Date: Jun. 7, 2013

(87) PCT Pub. No.: WO2012/042082
PCT Pub. Date: Apr. 5, 2012

(65) Prior Publication Data
US 2013/0298990 A1    Nov. 14, 2013

(30) Foreign Application Priority Data
Sep. 27, 2010   (ES) .................................. 201031430

(51) Int. Cl.
*H01L 31/052* (2014.01)
*G02B 19/00* (2006.01)
(Continued)

(52) U.S. Cl.
CPC ........ *H01L 31/0525* (2013.01); *G02B 19/0042* (2013.01); *G02B 19/0028* (2013.01);
(Continued)

(58) Field of Classification Search
CPC ............ H01L 31/0525; H01L 31/0522; H01L 31/0524

USPC .................................................... 136/246, 259
See application file for complete search history.

(56) References Cited

U.S. PATENT DOCUMENTS 3,218,924 A * 11/1965 Miller ........................... 359/456
3,232,795 A *  2/1966 Snyder et al. ................. 136/246
(Continued)

FOREIGN PATENT DOCUMENTS

ES          1071351        2/2010
WO    WO 2006/114457      11/2006
(Continued)

OTHER PUBLICATIONS

International Search Report for PCT/ES2010/070659 mailed Feb. 15, 2012, 3 pgs.

*Primary Examiner* — Golam Mowla
(74) *Attorney, Agent, or Firm* — Merchant & Gould P.C.

(57) ABSTRACT

A reflective photovoltaic solar concentration system is formed by a primary reflecting mirror (1) changing the direction of the light beams entering the system and redirecting the beams toward a secondary reflecting mirror (2), changing again the direction of the received light beams and redirecting them toward a tertiary optical element (3), which in turn transmits the received light beams to a photovoltaic receiver. The tertiary optical element (3) has a convex-curved input face (4) of circular section, and truncated pyramid section (5) which transmits the received light beams by complete internal reflection to a photovoltaic receiver. The leading end (6) of the truncated pyramid section (5) has, immediately after the input face (4), a circular cross-section (6) which is progressively transformed into a square cross-section until reaching the trailing end (7) of the truncated pyramid section (5).

9 Claims, 3 Drawing Sheets

(51) Int. Cl.
- *F24J 2/18* (2006.01)
- *H01L 31/054* (2014.01)
- *F24J 2/12* (2006.01)
- *F24J 2/14* (2006.01)
- *F24J 2/10* (2006.01)

(52) U.S. Cl.
CPC .............. *G02B19/0076* (2013.01); *F24J 2/12* (2013.01); *F24J 2/14* (2013.01); *F24J 2/18* (2013.01); *F24J 2002/1019* (2013.01); *F24J 2002/1023* (2013.01); *Y02E 10/40* (2013.01); *Y02E 10/52* (2013.01); *H01L 31/0547* (2014.12)

(56) References Cited

U.S. PATENT DOCUMENTS

| | | | | |
|---|---|---|---|---|
| 3,427,200 | A * | 2/1969 | Ernest et al. | 136/246 |
| 3,899,672 | A * | 8/1975 | Levi-Setti | 359/869 |
| 3,923,381 | A * | 12/1975 | Winston | 359/852 |
| 4,003,756 | A * | 1/1977 | Abrams | 136/246 |
| 4,029,519 | A * | 6/1977 | Schertz et al. | 136/246 |
| 4,045,246 | A * | 8/1977 | Mlavsky et al. | 136/246 |
| 4,077,393 | A * | 3/1978 | Mattson | 126/709 |
| 4,078,548 | A * | 3/1978 | Kapany | 126/648 |
| 4,088,121 | A * | 5/1978 | Lapeyre | 126/606 |
| 4,114,592 | A * | 9/1978 | Winston | 126/683 |
| 4,140,142 | A * | 2/1979 | Dormidontov et al. | 136/246 |
| 4,248,643 | A * | 2/1981 | Peters | 136/248 |
| 4,284,839 | A * | 8/1981 | Johnson | 136/246 |
| 4,863,224 | A * | 9/1989 | Afian et al. | 359/15 |
| 5,062,899 | A | 11/1991 | Kruer | |
| 5,118,361 | A * | 6/1992 | Fraas et al. | 136/246 |
| 5,280,557 | A * | 1/1994 | Nwasokwa | 385/146 |
| 5,611,870 | A * | 3/1997 | Horne et al. | 136/253 |
| 5,865,905 | A * | 2/1999 | Clemens | 136/245 |
| 6,201,179 | B1 * | 3/2001 | Dalacu | 136/244 |
| 6,274,860 | B1 * | 8/2001 | Rosenberg | 250/203.4 |
| 6,276,359 | B1 * | 8/2001 | Frazier | 126/686 |
| 6,666,207 | B1 * | 12/2003 | Arkas et al. | 126/685 |
| 6,903,261 | B2 * | 6/2005 | Habraken et al. | 136/246 |
| 2002/0007845 | A1 * | 1/2002 | Collette et al. | 136/246 |
| 2008/0137205 | A1 | 6/2008 | Spencer et al. | |
| 2009/0106648 | A1 | 4/2009 | Mogilevsky et al. | |
| 2009/0114213 | A1 | 5/2009 | McDonald et al. | |

FOREIGN PATENT DOCUMENTS

| | | |
|---|---|---|
| WO | WO 2008/131566 | 11/2008 |
| WO | WO 2009/058603 | 5/2009 |
| WO | WO 2009/086293 | 7/2009 |
| WO | WO 2011/051510 | 5/2011 |

* cited by examiner

REFLECTIVE PHOTOVOLTAIC SOLAR CONCENTRATION SYSTEM

This application is a National Stage Application of PCT/ES2011/070659, filed 22 Sep. 2011, which claims benefit of Serial No. P201031430, filed 27 Sep. 2010 in Spain and which application(s) are incorporated herein by reference. To the extent appropriate, a claim of priority is made to each of the above disclosed applications.

TECHNICAL FIELD OF THE INVENTION

The present invention belongs to the technical field of photovoltaic solar concentration systems for harnessing solar energy for producing electric power, specifically to high-concentration photovoltaic solar concentration systems, and more specifically to systems primarily formed by a primary concentrating mirror, a secondary reflecting element, a tertiary optical element functioning by complete internal reflection, and a photovoltaic receiver.

BACKGROUND OF THE INVENTION

A number of photovoltaic solar concentration (PSC) systems have been proposed and developed throughout the twentieth century until present day. Despite this long history, these state of the art systems are not currently competitive in terms of cost and efficiency with respect to the traditional forms of producing energy.

Documents WO2006114457, US2009106648 and WO2009058603 show the typical operating scheme of a photovoltaic solar concentration system. Said system consists of a light concentrating Fresnel lens and a secondary optical element providing the system with greater concentration. Various systems using Fresnel lenses have been proposed with and without secondary optics.

Concentration systems by means of light guiding have recently been reported, as described in document WO2008131566. Said systems are characterized by their greater compactness compared to traditional systems.

There are other photovoltaic solar concentration systems based on Cassegrain technology. Said systems consist of a pair of reflecting mirrors and a homogenizing tertiary optical element. There are also other optical concentration elements based on parabolic mirrors. Said systems can be formed by mirrors or they can be an entirely solid system based on Complete Internal Reflection (CIR), as described in documents WO2009058603 and WO2009086293.

Different types of tertiary optical elements, such as prisms with straight or curved walls, or Kohler type systems, as can be observed in FIG. 2, in which tertiary optical elements are not used, have been disclosed for said Cassegrain systems.

An ideal photovoltaic solar concentration system must have the following features in order to be competitive: it must minimize losses in optical concentration systems, i.e., achieve greater optical efficiency; they must be cost effective solutions with long-term reliability; they must be compact and achieve maximum thermodynamic efficiency, i.e., they must reach the maximum degree of concentration possible in a design that absorbs the manufacturing tolerances of the system and deviations of the solar tracker.

Maximizing thermodynamic efficiency means maximizing the use of the etendue. The concept of etendue was described by Dr. Winston et al. in Non Imaging Optics and is highly important in a photovoltaic solar concentration system. Maximizing the etendue means maximizing the acceptance angle of a system for a particular degree of concentration, or maximizing the concentration for a defined acceptance angle. A maximum etendue use module has the potential to effectively concentrate solar radiation, minimizing the cost of the semiconductor element and accordingly of the module. It also provides the system with the tolerance necessary for being assembled in real solar tracking systems and allowing the manufacturing tolerances of the module without it affecting the output thereof.

The maximum degree of concentration that can be attained for an acceptance angle is defined by the following equation:

$$C\max = \frac{(n^2 \cdot \text{sine}(\theta_1)^2)}{(\text{sine}(\theta_2)^2)}$$

wherein n is the refractive index of the medium in which is submerged the photovoltaic receiver, $\theta_1$ is the angle of entry in the photovoltaic cell and $\theta_2$ the acceptance angle in the system. Maximizing the use of the etendue involves being as close as possible to Cmax for defined n, $\theta_1$ and $\theta_2$.

The photovoltaic solar concentration systems by means of Fresnel lenses have been the most widely used up until now because it is a known, standard and cost effective technology. However, they are not excessively compact systems and they do not maximize the etendue use. Nevertheless, certain documents have been published for the purpose of maximizing the etendue use using lens systems with very high focal distances and secondary elements with a certain curvature at the entry.

Reflective systems are progressively being introduced, are generally more compact than refractive systems, and with the suitable design, maximize etendue use compared to lenses.

The light guiding systems are the most compact. However they have yet to prove their optical efficiency, costs and long-term reliability.

A system achieving a high photovoltaic solar concentration that prevents the drawbacks existing in the earlier systems in the state of the art was therefore desirable.

DESCRIPTION OF THE INVENTION

The present invention solves the problems existing in the state of the art by means of a reflective photovoltaic solar concentration system.

The purpose of the invention is to provide a high optical efficiency, compact, and cost effective photovoltaic concentration system that maximizes the acceptance angle for a given concentration.

The system has a primary reflecting mirror that redirects the entering solar light beams by changing their flow direction. This primary reflecting mirror is defined by a conical surface having the equation:

$$z = \frac{c_1 \cdot r^2}{1 + \sqrt{1 - (1 + k_1)c_1^2 \cdot r^2}}$$

wherein the constants $c_1$ and $k_1$ are optimized for maximizing the transmission of light on the surface of the primary reflecting mirror generated by said equation.

The system has a secondary reflecting mirror which again redirects the received light beams of the primary reflecting mirror. This secondary reflecting mirror is also defined by a conical surface having the equation:

$$z = \frac{c_2 \cdot r^2}{1 + \sqrt{1 - (1+k_2)c_2^2 \cdot r^2}}$$

wherein the constants $c_2$ and $k_2$ are optimized for maximizing the transmission of light on the surface of the secondary reflecting mirror generated by said equation.

The system additionally has a solid tertiary optical element which receives the light beams directed from the secondary reflecting mirror and transmits them to a photovoltaic receiver.

This tertiary optical element has a convex-curved input face of circular section for the light beams, and then a pyramid section transmitting the light beams by complete internal reflection. Said pyramid section changes in section progressively from circular to square. A maximum acceptance angle with square photovoltaic cells is thereby coupled.

The tertiary optical element can optionally have an area or lip arranged around the input face. This lip can house alignment marks and serves as a support for mechanical securing elements. The perimeter of the lip can be circular or square, depending on the molding method.

The reflective photovoltaic solar concentration systems object of the present invention has certain advantages with respect to conventional systems with Fresnel lenses.

First, this concentrating system is formed by mirrors. Mirrors do not have chromatic aberrations, meaning clearer focal points and higher degrees of concentration than those achieved with Fresnel lenses.

The mirrors can also have much higher radii of curvature than lenses, making the system more compact. Greater compactness means lower cost in terms of materials of the module and a lighter weight of the structure. As a consequence, the costs in terms of material of the tracker are reduced as such high loads do not have to be withstood.

The main advantage of this system compared to other similar reflective systems is based on the use of the tertiary optical element with the described shape. Said element provides the system with a large acceptance angle. This allows higher concentration ratios, maintaining acceptable levels of the acceptance angle necessary for the trackers. All these features result in a cost savings in the module (little use of the semiconductor element) and in the tracker (acceptance angle much larger than that of conventional designs). As an example of the mentioned efficiency, systems have been designed that are capable of concentration solar radiation up to 1000 times with half acceptance angles of 1.3 degrees. This means that the production tolerances of the modules as well as of the solar tracking would be simplified, resulting in lower costs.

DESCRIPTION OF THE DRAWINGS

To aid in understanding the invention, an embodiment of the invention will be described below in reference to a series of drawings by way of non-limiting illustration.

Figure 1:
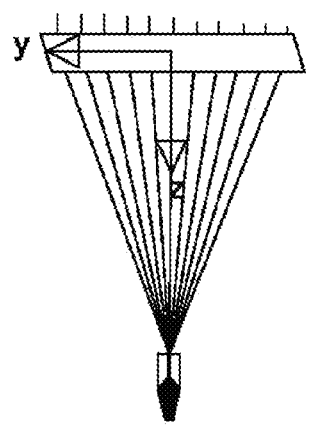
FIG. 1 is a typical operating scheme of a photovoltaic solar concentration system known in the state of the art.
Figure 2:
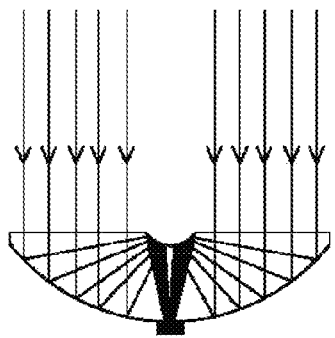
FIG. 2 shows the operation of another photovoltaic solar concentration system based on Cassegrain technology, also known in the state of the art. Said concentrating system does not have tertiary optical elements.
Figure 3:
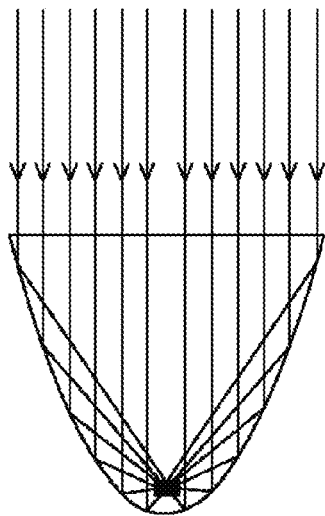
FIG. 3 shows optical concentration elements based on parabolic mirrors also existing in the state of the art.
Figure 4:
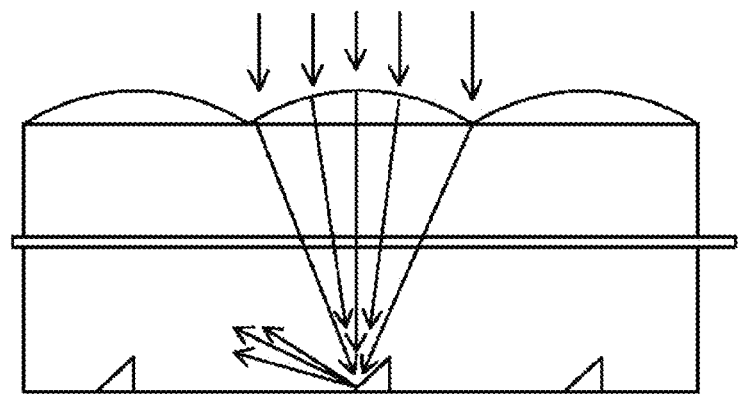
FIG. 4 shows a concentration system by means of light guiding already existing in the state of the art.

Reference is made to the following set of elements in these drawings:
1. primary reflecting mirror
2. secondary reflecting mirror
3. tertiary optical element
4. input face of the tertiary optical element
5. truncated pyramid section of the tertiary optical element
6. leading end of the truncated pyramid section
7. trailing end of the truncated pyramid section
8. lip of the tertiary optical element

DESCRIPTION OF PREFERRED
EMBODIMENTS OF THE INVENTION

Figure 5:
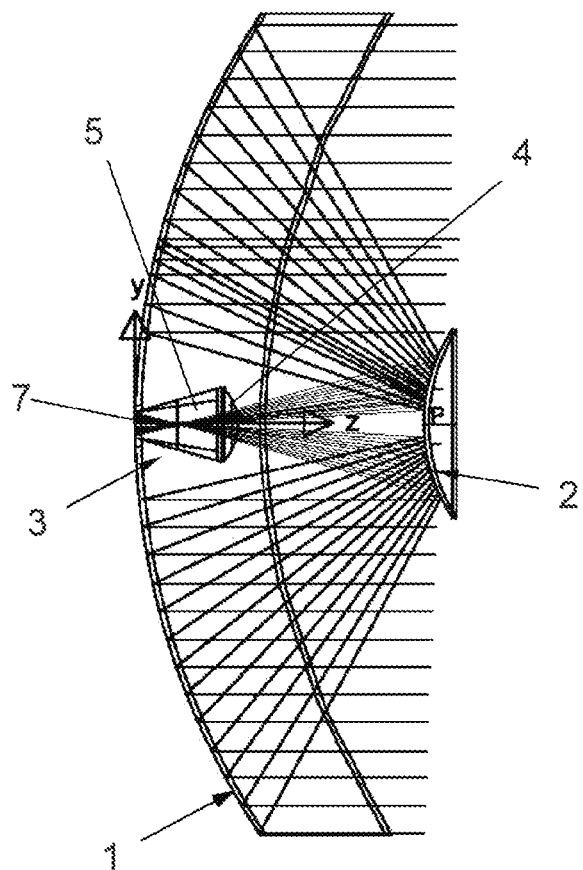
FIG. 5 shows an embodiment of the reflective photovoltaic solar concentration system object of the present invention.
Figure 6:
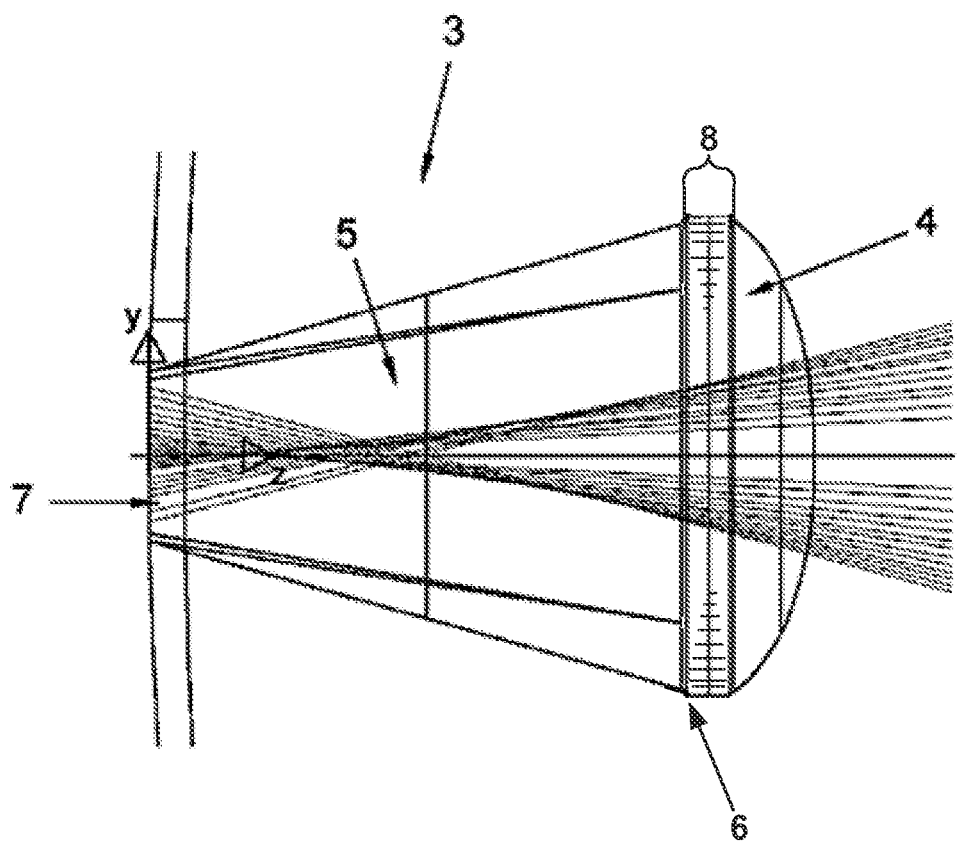
FIG. 6 shows an enlarged view of an embodiment of the tertiary optical element described in the present invention.

As can be seen in FIGS. 5 and 6, the object of the present invention is a reflective photovoltaic solar concentration systems formed by a primary reflecting mirror 1, a secondary reflecting mirror 2, and a tertiary optical element 3.

The primary reflecting mirror 1 changes the direction of the solar light beams entering the system and redirects them toward the secondary reflecting mirror 2, which again changes the direction of the received light beams and redirects them toward the tertiary optical element 3.

The tertiary optical element 3 is formed by a convex-curved input face 4 of circular section and by a truncated pyramid section 5 which transmits the received light beams by complete internal reflection to a photovoltaic receiver.

The leading end 6 of the truncated pyramid section 5 has, immediately after the input face 4, a circular cross-section 6 which is progressively transformed into a square cross-section until reaching the trailing end 7 of the truncated pyramid section 5.

According to a preferred embodiment of the invention shown in FIGS. 5 and 6, the tertiary optical element 3 of the reflective concentration system has a lip 8 arranged around the input face 4. This lip 8 can have a square or circular geometry and can be optically active or inactive.

Also, depending on different methods for manufacturing this tertiary optical element 3, the lip 8 can be integral with the tertiary optical element 3, or it can be independent of said tertiary optical element 3, subsequently being fixed to it.

As previously indicated, for the optimal operation of the system, both the primary reflecting mirror 1 and the secondary reflecting mirror 2 are defined by respective conical superficies having equations $$z = \frac{c_1 \cdot r^2}{1 + \sqrt{1 - (1+k_1)c_1^2 \cdot r^2}}$$

and $$z = \frac{c_2 \cdot r^2}{1 + \sqrt{1 - (1+k_2)c_2^2 \cdot r^2}}$$

wherein the constants $c_1$ and $k_1$ for the primary reflecting mirror 1, and $c_2$ and $k_2$ for the secondary reflecting mirror 2, are optimized for maximizing the transmission of the light beams on the superficies of said reflecting mirrors 1, 2.

The described system is particularly defined by a geometric concentration of 1000×, concentrating the radiation in a 10×10 mm² photovoltaic cell. This defines a primary reflecting mirror 1 of 316.5×316.5 mm². The secondary reflecting mirror 2 is of a circular section with a diameter of 72 mm.

The tertiary optical element has preferably been optimized to provide an acceptance angle of 1.3°. FIG. 6 shows the design of the tertiary optical element 3, which is capable of providing a geometric concentration of 1000× and an acceptance angle of 1.3°.

Having clearly described the invention, it is hereby stated that the particular embodiments described above are susceptible to modifications in detail provided that they do not alter the fundamental principal and essence of the invention.

The invention claimed is:

1. A reflective photovoltaic solar concentration system, comprising:
    a primary reflecting mirror changing direction of solar light beams entering the system and redirecting the solar light beams towards
    a secondary reflecting mirror changing the direction of received light beams and redirecting the solar light beams towards
    a tertiary optical element, the tertiary optical element comprising:
        a convex-curved input face of circular section, and
        a truncated pyramid section proximate the convex-curved input face, the truncated pyramid section transmitting the received light beams by complete internal reflection to a photovoltaic receiver, a leading end of the truncated pyramid section comprising a circular cross-section proximate the convex-curved input face, the truncated pyramid section progressively transitioning into a square cross-section at a trailing end of the truncated pyramid section.

2. The reflective photovoltaic solar concentration system according to claim 1, wherein the tertiary optical element comprises a lip placed around the convex-curved input face.

3. The reflective photovoltaic solar concentration system according to claim 2, wherein the lip of the tertiary optical element is optically inactive.

4. The reflective photovoltaic solar concentration system according to claim 2, wherein the lip of the tertiary optical element is optically active.

5. The reflective photovoltaic solar concentration system according to claim 2, wherein the lip is integral with the tertiary optical element.

6. The reflective photovoltaic solar concentration system according to claim 2, wherein the lip is independent of the tertiary optical element.

7. The reflective photovoltaic solar concentration system according to claim 1, wherein the primary reflecting mirror is defined by a conical surface having the equation $$z = \frac{c_1 \cdot r^2}{1 + \sqrt{1 - (1 + k_1)c_1^2 \cdot r^2}}$$

wherein the constants $c_1$ and $k_1$ are optimized for maximizing transmission of light on the surface of the primary reflecting mirror generated by said equation.

8. The reflective photovoltaic solar concentration system according to claim 1, wherein the secondary reflecting mirror is defined by a conical surface having the equation $$z = \frac{c_2 \cdot r^2}{1 + \sqrt{1 - (1 + k_2)c_2^2 \cdot r^2}}$$

wherein the constants $c_2$ and $k_2$ are optimized for maximizing transmission of light on the surface of the secondary reflecting mirror generated by said equation.

9. The reflective photovoltaic solar concentration system according to claim 1, wherein
    the photovoltaic receiver has a surface of 10×10 mm²,
    the primary reflecting mirror has a surface of 316.5×316.5 mm²,
    and the secondary reflecting mirror is of a circular section and has a diameter of 72 mm.

* * * * *